(12) United States Patent
Kuo et al.

(10) Patent No.: US 11,177,419 B2
(45) Date of Patent: Nov. 16, 2021

(54) OPTICAL DEVICE

(71) Applicant: Innolux Corporation, Miao-Li County (TW)

(72) Inventors: Shu-Ming Kuo, Miao-Li County (TW); Tsau-Hua Hsieh, Miao-Li County (TW)

(73) Assignee: Innolux Corporation, Miao-Li County (TW)

(*) Notice: Subject to any disclaimer, the term of this patent is extended or adjusted under 35 U.S.C. 154(b) by 0 days.

(21) Appl. No.: 16/878,619

(22) Filed: May 20, 2020

(65) Prior Publication Data
US 2020/0381599 A1    Dec. 3, 2020

Related U.S. Application Data

(60) Provisional application No. 62/854,958, filed on May 30, 2019.

(30) Foreign Application Priority Data

Mar. 3, 2020 (CN) .......................... 202010140334.4

(51) Int. Cl.
*H01L 33/50* (2010.01)
*H01L 25/075* (2006.01)

(52) U.S. Cl.
CPC ........ *H01L 33/505* (2013.01); *H01L 25/0753* (2013.01)

(58) Field of Classification Search
None
See application file for complete search history.

(56) References Cited

U.S. PATENT DOCUMENTS

| 2004/0046184 | A1  | 3/2004  | Yanagawa et al. |
| 2010/0289728 | A1* | 11/2010 | Nakatani ............. H01L 27/3246 345/76 |
| 2018/0237690 | A1  | 8/2018  | Chung et al. |
| 2019/0121176 | A1  | 4/2019  | Lee et al. |

OTHER PUBLICATIONS

"Search Report of Europe Counterpart Application", dated Sep. 16, 2020, p. 1-p. 8.

* cited by examiner

*Primary Examiner* — Bo B Jang
(74) *Attorney, Agent, or Firm* — JCIPRNET

(57) ABSTRACT

An optical device includes two substrates disposed opposite to each other. Each of the substrates has a surrounding edge and a side surface at the surrounding edge. A wavelength conversion layer is disposed between the two substrates. A light emitting unit corresponding to the wavelength conversion layer is disposed between the corresponding wavelength conversion layer and one of the two substrates. A sealing element is disposed along the edges and in contact with the side surfaces of the two substrates, and seals the wavelength conversion layer and the light emitting unit located between the two substrates.

7 Claims, 11 Drawing Sheets

OPTICAL DEVICE

CROSS-REFERENCE TO RELATED APPLICATION

This application claims the priority benefits of U.S. provisional application Ser. No. 62/854,958, filed on May 30, 2019, and China application serial no. 202010140334.4, filed on Mar. 3, 2020. The entirety of each of the above-mentioned patent applications is hereby incorporated by reference herein and made a part of this specification.

BACKGROUND OF THE DISCLOSURE

1. Field of the Disclosure

The disclosure relates to a technology of an optical device, and more particularly, to a structure of a light emitting panel.

2. Description of Related Art

Electronic devices including display panels have been widely used in various aspects of life, such as smart phones, tablet computers and televisions, for displaying images.

A display panel including light emitting units is taken as an example. The display panel includes two substrates disposed opposite to each other. Some member structure layers are first manufactured on individual substrates. Then the two substrates will be pasted together and the member structure layers will be disposed between the two substrates. Therefore, the two substrates are disposed opposite to each other on the outside. Optical members such as a light emitting unit, a wavelength conversion layer and/or a color filter layer are included between the two substrates. Therefore, the optical members are sandwiched between the two substrates.

In the optical members, for example, the wavelength conversion layer is easily affected by moisture and/or oxygen to reduce performance. How to protect an optical member between two substrates is an issue to be considered.

SUMMARY OF THE DISCLOSURE

The disclosure provides an optical device. Optical members between two substrates may be protected. The invasion of moisture and/or oxygen into the optical device may be reduced. An ability of the optical device to block moisture and/or oxygen is improved accordingly.

In one embodiment, the disclosure provides an optical device which includes two substrates disposed opposite to each other. Each of the substrates has a surrounding edge and a side surface at the surrounding edge. A wavelength conversion layer is disposed between the two substrates. A light emitting unit corresponding to the wavelength conversion layer is disposed between the corresponding wavelength conversion layer and one of the two substrates. A sealing element is disposed along the edges and in contact with the side surfaces of the two substrates, and seals the wavelength conversion layer and the light emitting unit located between the two substrates.

For a better understanding of the above and other aspects of the disclosure, the following gives a detailed description of embodiments with reference to accompanying drawings.

DESCRIPTION OF THE EMBODIMENTS

Figure 1:
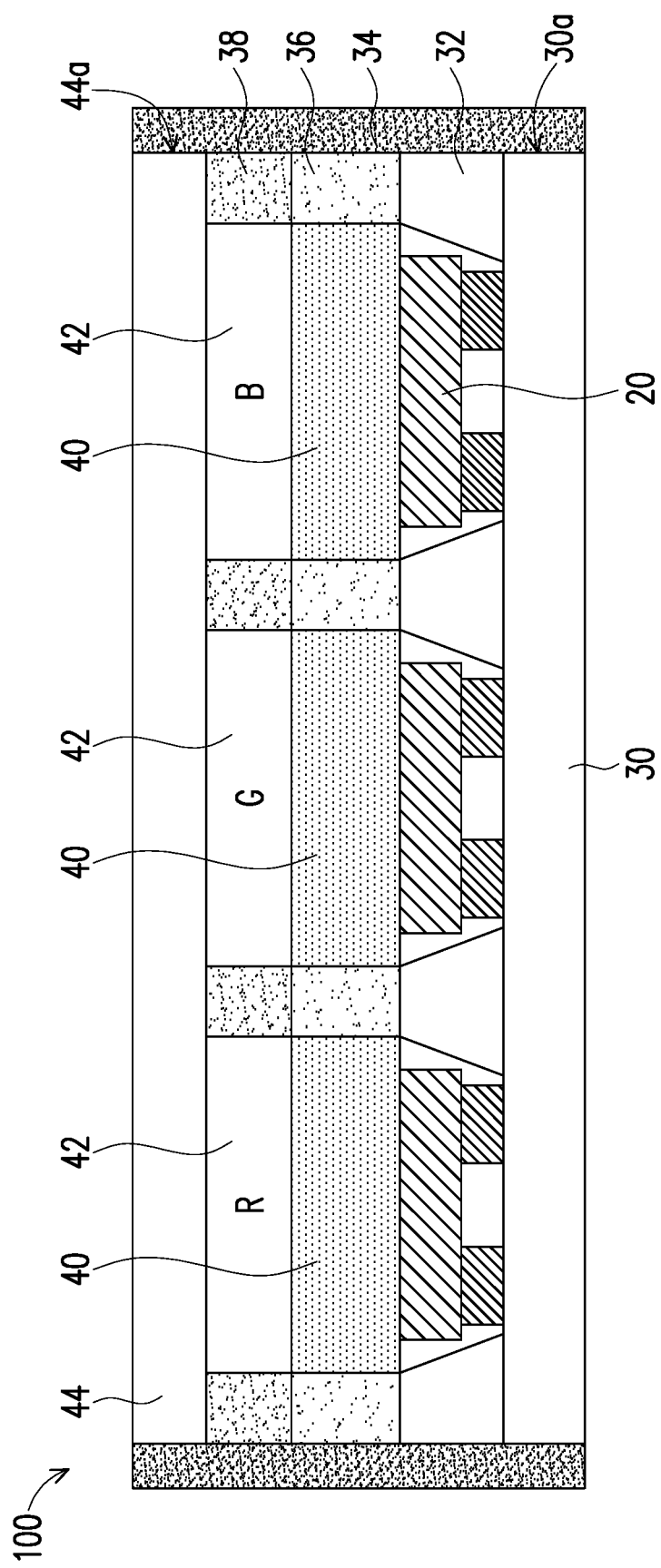
FIG. 1 is a schematic cross-sectional structure diagram of an optical device according to one embodiment of the disclosure.

In this specification, some embodiments of the disclosure are described with reference to the accompanying drawings. Actually, these embodiments may have different deformations, and are not limited to the embodiments in this specification. The same reference symbols in the accompanying drawings are used to indicate the same or similar components.

The disclosure may be understood with reference to the following detailed description and the accompanying drawings. It should be noted that, for ease of understanding by readers and concise drawings, a plurality of drawings in the disclosure merely show a part of an electronic device, and specific components in the drawings are not drawn to scale. In addition, the quantity and size of the components in the drawings are merely exemplary, and are not intended to limit the scope of the disclosure.

Some words are used to refer to specific components in the whole specification and the appended claims in the disclosure. A person skilled in the art should understand that an electronic device manufacturer may use different names to refer to the same components. This specification is not intended to distinguish components that have the same functions but different names. In this specification and the claims, words such as "include", "comprise", and "have" are open words, and should be interpreted as "including, but not limited to". Therefore, when terms "include", "comprise", and/or "have" are used in the description of the disclosure, the presence of corresponding features, regions, steps, operations and/or components is specified without excluding the presence of one or more other features, regions, steps, operations and/or components.

The directional terms mentioned herein, like "above", "below", "front", "back", "left", and "right", refer to the directions in the accompanying drawings. Therefore, the directional terms are only used for illustration instead of limiting the disclosure. In the accompanying drawings, common features of a method, a structure and/or a material used in a specific embodiment are shown in the drawings. However, these drawings should not be construed as defining or limiting the scope or nature of these embodiments. For example, the relative sizes, thicknesses and positions of films, regions and/or structures may be reduced or enlarged for clarity.

When a corresponding component such as a film or a region is referred to as being "on another component", it may be directly on the another component, or there may be other components between the two components. In another aspect, when a component is referred to as being "directly on another component", there is no component between the two components. In addition, when a component is referred to as being "on another component", the two components have an up and down relationship in a top view. The component may be located above or below the another component, and the up and down relationship depends on the orientation of the device.

It should be understood that, when a component or a film is referred to as being "connected to" another component or film, it may be directly connected to the another component or film, or there are components or films inserted between the two components or films. When a component or a film is referred to as being "directly connected to" another component or film, there is no component or film inserted between the two components or films. In addition, when a component is referred to as being "coupled to another component (or a variant thereof)", it may be directly connected to the another component, or may be indirectly connected to (for example, electrically connected to) the another component through one or more components.

Ordinal numbers used in this specification and the claims, like "first" and "second", are used to modify the components, and do not imply or represent that the (or these) component (or components) has (or have) any ordinal number, and do not indicate any order between a component and another component, or an order in a manufacturing method. These ordinal numbers are merely used to clearly distinguish a component having a name with another component having the same name. Different terms may be used in the claims and the specification, so that a first component in the specification may be a second component in the claims.

In the disclosure, an electronic device may include a display device, an optical device, another suitable electronic device, or a combination of the above devices, but is not limited thereto.

In the disclosure, the optical device may include an organic light-emitting diode (OLED) and an inorganic light-emitting diode (LED), for example, a micro-LED or mini-LED, a quantum dot light-emitting diode (QLED or QDLED) or a similar light-emitting component. A quantum dot (QD) material, a fluorescence material, a phosphor material, another suitable material, or a combination of the above materials may be used in the light-emitting diode, but the disclosure is not limited thereto.

The following describes the technology of the disclosure by listing some embodiments. However, the disclosure is not limited to the listed embodiments, and the embodiments may be combined properly.

An optical device of the disclosure, for example, a light emitting panel of a light emitting diode, may have a better moisture and/or oxygen blocking function, and particularly strengthen the moisture and/or oxygen blocking function on edges of the light emitting panel.

FIG. 1 is a schematic cross-sectional structure diagram of an optical device according to one embodiment of the disclosure. Referring to FIG. 1, an optical device 100 includes a structure in which a substrate 30 and a substrate 44 are disposed opposite to each other. Each of the substrate 30 and substrate 44 has a surrounding edge, and the substrate 30 has a side surface 30a and the substrate 44 has a side surface 44a at the surrounding edge, respectively. Optical members are disposed between the substrate 30 and the substrate 44. According to some embodiments, some optical members may be formed on the substrate 30 or the substrate 44 respectively. The substrate 30 and the substrate 44 are then combined together to form the optical device 100.

In some embodiments, a pixel definition layer 32 is formed on the substrate 30, and defines a space in which a light emitting unit 20 may be accommodated. The substrate 30 may include, for example, a circuit (not shown) that drives the light emitting unit 20. The light emitting unit 20 is, for example, a light emitting diode. A wavelength of light emitted therefrom is, for example, within a wavelength range of ultraviolet light or blue light. The substrate 30 is, for example, glass or sapphire or the like, which has a low permeability to moisture and/or oxygen.

In addition, for example, a color filter layer 42 is formed on the substrate 44. The color filter layer 42 may include, but is not limited to, a red color filter layer, a green color filter layer and a blue color filter layer. For example, a light blocking layer, for example black matrix (BM) 38 is further included around the color filter layer 42, and isolates the color filter layers 42 of different colors. A bank structure 36 is further formed on the BM 38. A wavelength conversion layer 40 corresponding to the color filter layer 42 is filled in a space surrounded by the bank structure 36. The substrate 44 is also, for example, glass or sapphire or the like, which has a low permeability to moisture and/or oxygen.

In one embodiment, after the substrate 30 or the substrate 44 has formed the required optical members thereon respectively, the substrate 30 and the substrate 44 are combined together to form the optical device 100. Each light emitting unit 20 is a sub-pixel corresponding to one color light. The wavelength conversion layer 40 first converts a light emitted from the light emitting unit 20 into another light. Thereafter, the another light passes through the color filter layer 42 to obtain the color light, such as red light, green light or blue light.

In the optical members, for example, the wavelength conversion layer 40 is easily affected by moisture and/or oxygen to reduce quality. Although the substrate 30 or the substrate 44 has a better function of blocking moisture and/or oxygen, the BM 38, the bank structure 36 and/or the pixel definition layer 32 have relatively low moisture and/or oxygen blocking function. When the bank structure 36 and the pixel definition layer 32 are combined together, for example, by adhering, moisture and/or oxygen may also invade from the edges or from a joint surface between the bank structure 36 and the pixel definition layer 32.

The disclosure proposes an optical device 100 includes a sealing element 34, which is disposed at least along the edges of the substrates 30 and substrate 44 and in contact with the side surface 30a and the side surface 44a of the substrate 30 and the substrate 44 to reduce an opportunity that moisture and/or oxygen may invade from the edge and/or the joint surface. Therefore, a blocking ability of the optical device 100 to prevent moisture and/or oxygen invading from edge is improved.

In one embodiment, the sealing element 34 is in contact with the side surface 30a of the substrates 30 and the side surface 44a of the substrates 44, and covered thereon. In one embodiment, the sealing element 34 may seal a joint surface between the bank structure 36 and the pixel definition layer 32.

A material of the sealing element 34 is, for example, a siloxane-containing material or silicon oxide (SiOx), which may block moisture and/or oxygen, but the disclosure is not limited thereto.

According to the structure of FIG. 1, other designs may be made in the disclosure without being limited to the illustrated embodiments.

Figure 2:
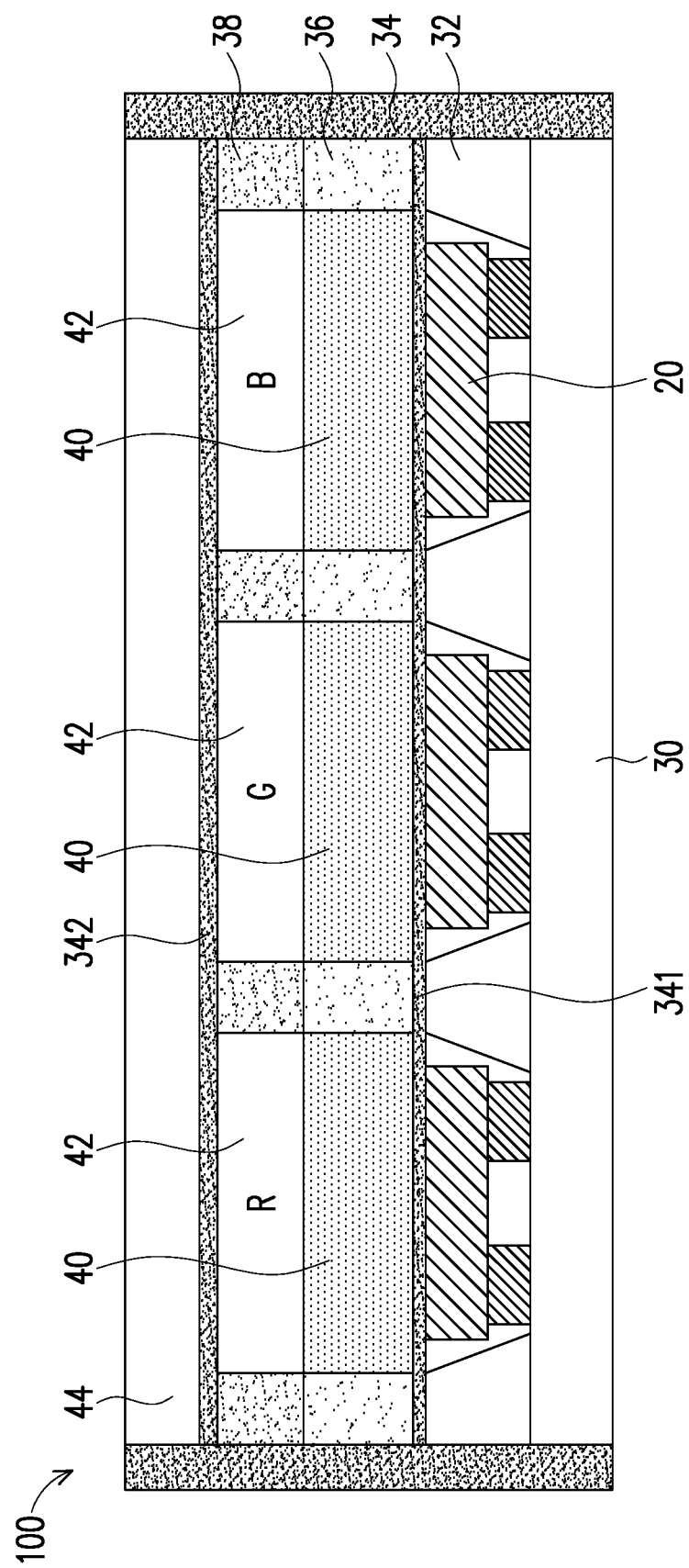
FIG. 2 is a schematic cross-sectional structure diagram of an optical device according to another embodiment of the disclosure.

FIG. 2 is a schematic cross-sectional structure diagram of an optical device according to another embodiment of the disclosure. Referring to FIG. 2, the consideration is to increase the protection of the wavelength conversion layer 40. For example, the substrate 44 is a material with higher moisture and/or oxygen permeability, such as, not limited to, Polyimide (PI), Polyethylene Terephthalate (PET), Polycarbonate (PC), Polymethylmetacrylate (PMMA), or similar materials. A moisture blocking layer 342 may be first formed on the substrate 44. In addition, a moisture blocking layer 341 may be formed on a surface of the wavelength conversion layer 40 and the wavelength conversion layer 40 is encapsulated by the moisture blocking layer 341 and the moisture blocking layer 342 which is formed on the substrate 44. After the combination of the substrate 44 and the substrate 30, the sealing element 34 is formed. The moisture blocking layer 342 and the moisture blocking layer 341 may block moisture and/or oxygen, etc., as a blocking layer of moisture and/or oxygen. The sealing element 34 combines the moisture blocking layer 341 and the moisture blocking layer 342 to seal the wavelength conversion layer 40. The blocking ability of the optical device 100 from moisture and/or oxygen may be improved.

The sealing element 34, the moisture blocking layer 341 and/or the moisture blocking layer 342 may be in a fluid state, or may be implemented by coating process or Physical Vapor Deposition (PVD) or Chemical Vapor Deposition (CVD) or similar technologies. The disclosure is not limited thereto.

Figure 3:
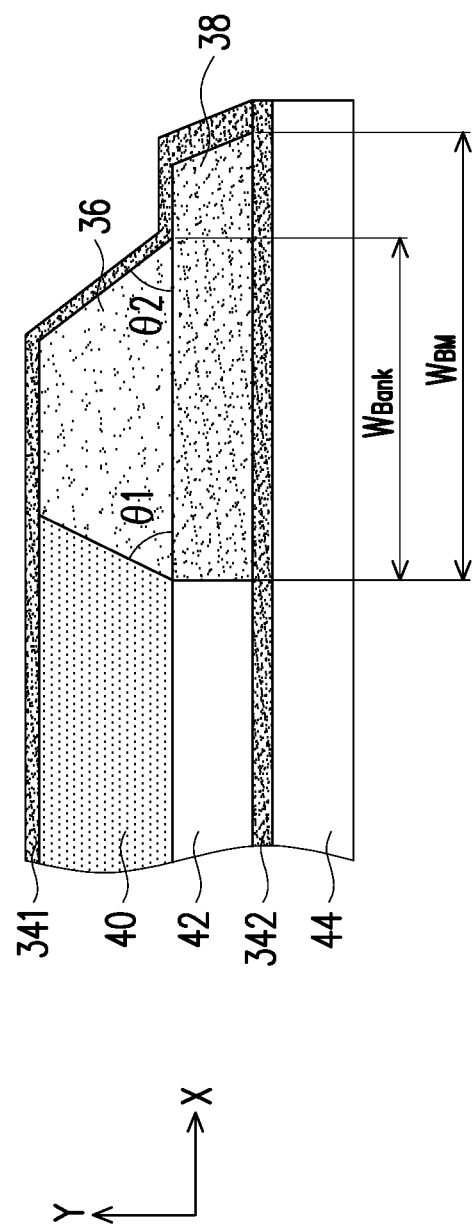
FIG. 3 is a schematic cross-sectional structure diagram of an edge of an optical device according to another embodiment of the disclosure.

FIG. 3 is a schematic cross-sectional structure diagram of an edge of an optical device according to another embodiment of the disclosure. Referring to FIG. 2 and FIG. 3, the moisture blocking layer 341 is disposed on the substrate 44. In the flow of a manufacturing process, a structure is formed from the substrate 44 upward. After forming the BM 38, the color filter layer 42, the bank structure 36 and the wavelength conversion layer 40, the moisture blocking layer 341 is formed on the substrate 44. In addition, for example, in the FIG. 2, the moisture blocking layer 341 may cover a part of the surface of the bank structure 36 and/or a part of the surface of the wavelength conversion layer 40. In one embodiment, the moisture blocking layer 341 may also cover a part of the surface of the BM 38 additionally.

In one embodiment, the bank structure 36 on the edge of the optical device has a trapezoid-like cross section shape. The bank structure 36 has a first taper portion on the outer sidewall and is covered by the moisture blocking layer 341. The bank structure 36 has a second taper portion on the inner sidewall and is not covered by the moisture blocking layer 341. In another embodiment, the cross section of the BM 38 may also be in a trapezoid-like shape. The BM 38 has a taper portion on the outer sidewall and is covered by the moisture blocking layer 341. An angle θ2 of the first taper portion of the bank structure 36 is less than an angle θ1 of the second taper portion of the bank structure 36. In addition, a maximum width $W_{BM}$ of the BM 38 is larger than a maximum width $W_{Bank}$ of the bank structure 36. For example, from a surface direction parallel to the substrate 44 or a X direction, the maximum width $W_{BM}$ of the BM 38 is larger than the maximum width $W_{Bank}$ of the bank structure 36.

Under geometrical conditions, if the moisture blocking layer 341 is in a fluid state, the moisture blocking layer 341 is easier to cover an outer sidewall of the bank structure 36 and/or the BM 38. In addition, as shown in the structure of the embodiment of FIG. 2, the moisture blocking layer 342 may be first formed on the substrate 44 to protect the wavelength conversion layer 40, the color filter layer 42 and the BM 38.

In one embodiment, when the substrate 44 is a material with low moisture and/or oxygen permeability, the moisture blocking layer 342 may not be required. At this time, the wavelength conversion layer 40 may be sealed by the moisture blocking layer 341 and the substrate 44.

In one embodiment, the substrate 44 and the optical members thereon, such as the wavelength conversion layer 40, the color filter layer 42, the bank structure 36 and the BM 38, may be first covered with the moisture blocking layer 341 to improve an ability to block moisture and/or oxygen, and then combined with the substrate 30 together to form the optical device 100. Thereafter, the sealing element 34 may still be formed on the edge of the optical device 100 to improve the ability of the optical device 100 to block moisture and/or oxygen.

According to the disclosure, the optical device may have various other changes, which are not limited to the illustrated embodiments.

Figure 4A:
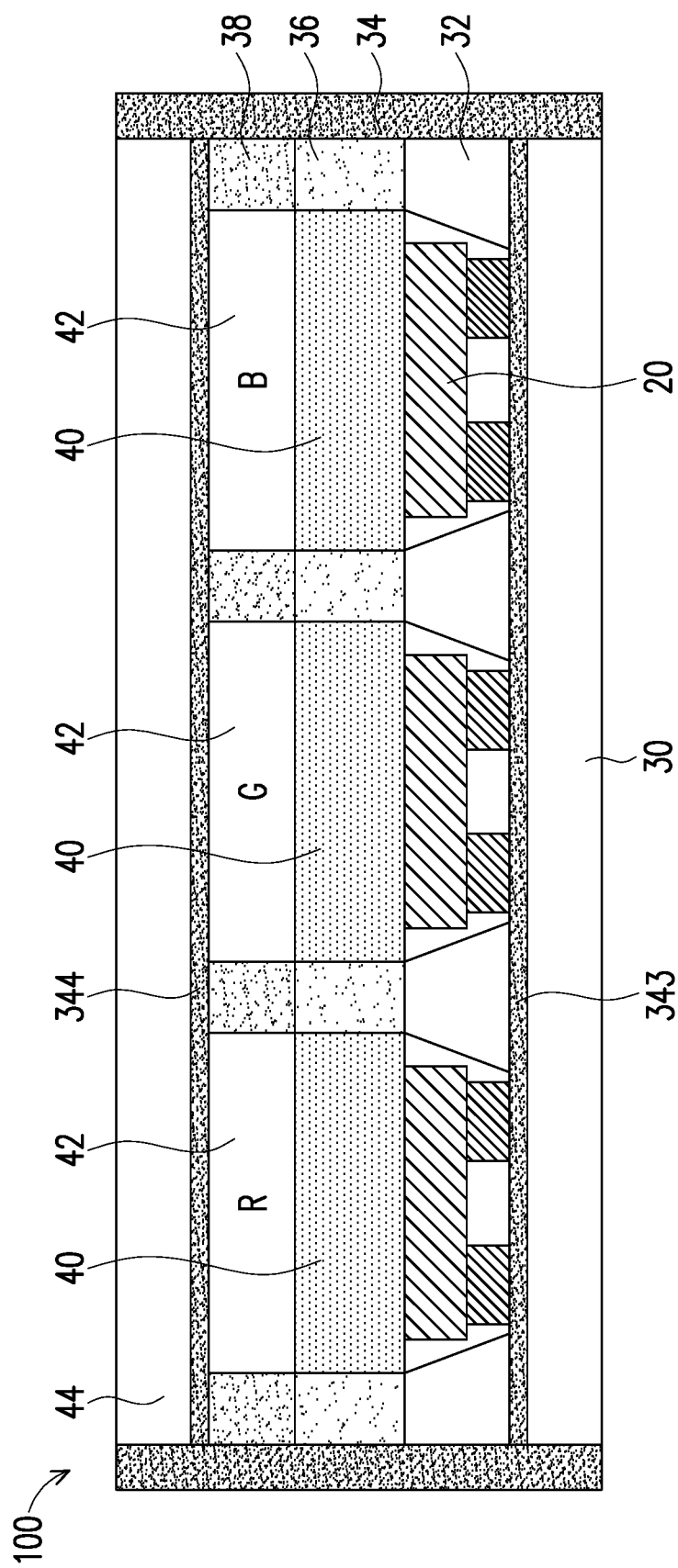
FIG. 4A and FIG. 4B are schematic cross-sectional structure diagrams of an optical device according to another embodiment of the disclosure.
Figure 4B:
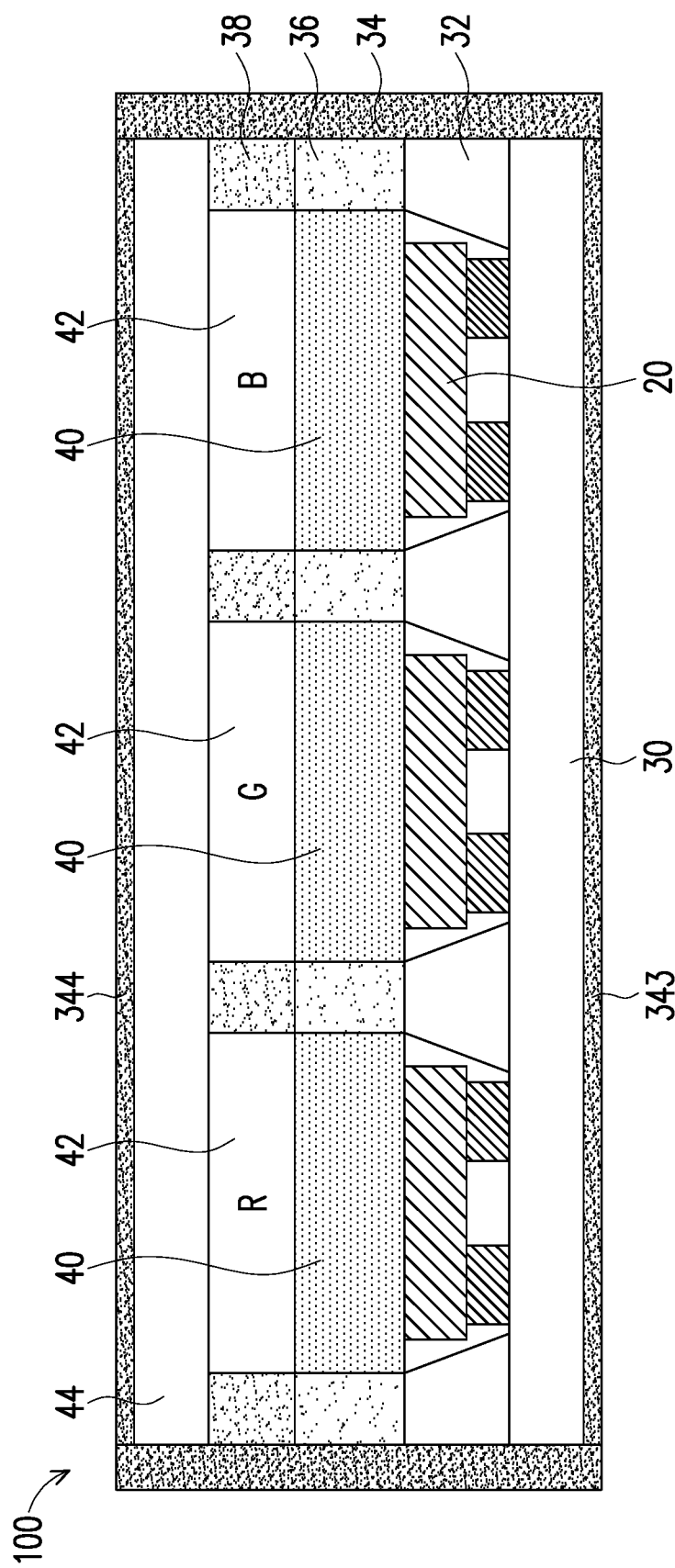

FIG. 4A and FIG. 4B are schematic cross-sectional structure diagrams of an optical device according to another embodiment of the disclosure.

Referring to FIG. 4A, based on the structure of the embodiment of FIG. 1, a part of the embodiment of FIG. 2 is further matched. The optical device 100 in FIG. 4A further includes a moisture blocking layer 343 and a moisture blocking layer 344, which are formed on the substrate 30 and the substrate 44, respectively. The sealing element 34 is jointed with the moisture blocking layer 343 and the moisture blocking layer 344. Therefore, the wavelength conversion layer 40, the color filter layer 42, the bank structure 36, the BM 38, and the light emitting unit 20 may be sealed by the sealing element 34, the moisture blocking layer 343 and the moisture blocking layer 344. The ability of the optical device 100 to block moisture and/or oxygen may be improved. The optical members on the substrate 30 and the substrate 44 may be protected. The optical members are as described above and will not be described again here.

Referring to FIG. 4B, similar to the structure of FIG. 4A, the moisture blocking layer 343 and the moisture blocking layer 344 may also be formed on the outside of the substrate 30 and the substrate 44 before the optical member is manufactured. In another embodiment, the moisture blocking layer 343 and the moisture blocking layer 344 may also be formed on the outside of the substrate 30 and the substrate 44 during the process of forming the optical member. In another embodiment, the moisture blocking layer 343 and the moisture blocking layer 344 may also be formed on the outside of the substrate 30 and the substrate 44 after the substrate 30 and the substrate 44 are combined into the optical device 100. After the substrate 30 and the substrate 44 are combined into the optical device 100, the sealing element 34 may be formed on the edge of the optical device 100. Therefore, the wavelength conversion layer 40, the color filter layer 42, the bank structure 36, the BM 38, and the light emitting unit 20 may be sealed by the sealing element 34, the moisture blocking layer 343 and the moisture blocking layer 344 to improve the ability of the optical device 100 to block moisture and/or oxygen.

In another embodiments, the wavelength conversion layer and the light emitting unit will be encapsulated by the moisture blocking layer in association with the substrates.

Here, in the FIG. 4A and FIG. 4B, a jointing mechanism between the substrate 30 and the substrate 44 may be designed, for example, in FIG. 3. The substrate 44 is covered by the moisture blocking layer 341, but the disclosure is not limited thereto.

In one embodiment, FIG. 4A and FIG. 4B are based on the substrate 30 and the substrate 44 which are materials with higher moisture and/or oxygen permeability, such as, but not limited to, PI or PC or PMMA.

Figure 5A:
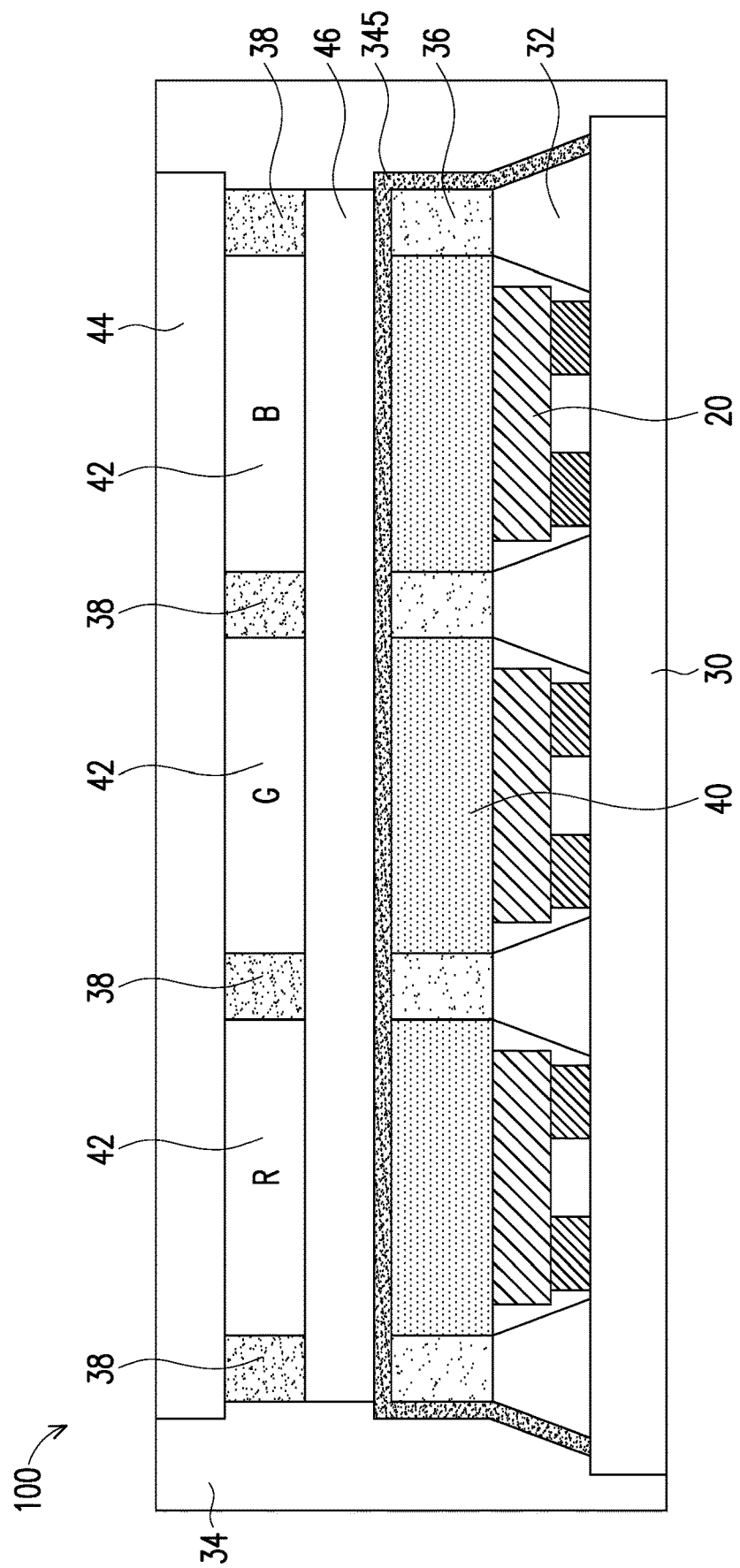
FIG. 5A to FIG. 5C are schematic cross-sectional structure diagrams of an optical device according to another embodiment of the disclosure.
Figure 5B:
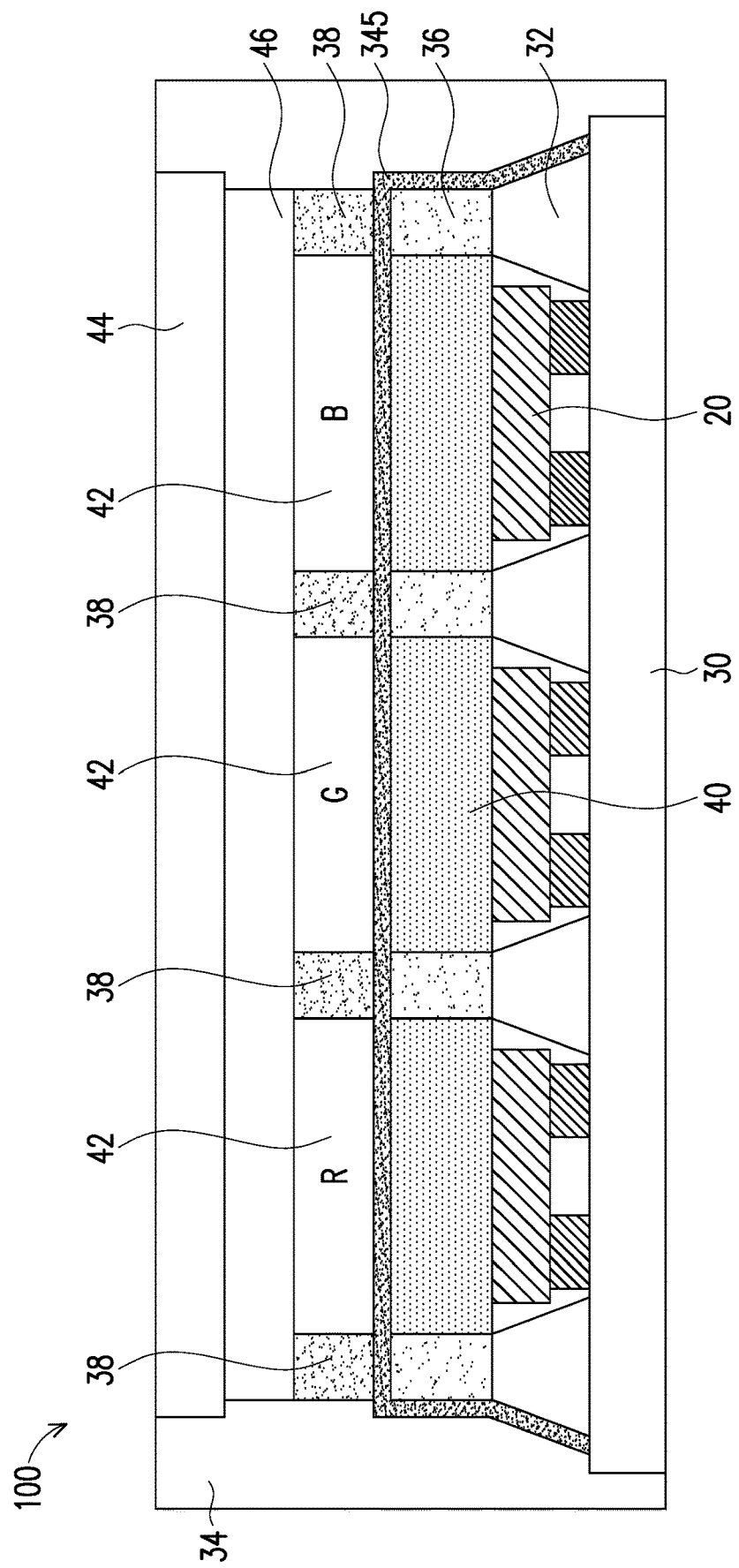
Figure 5C:
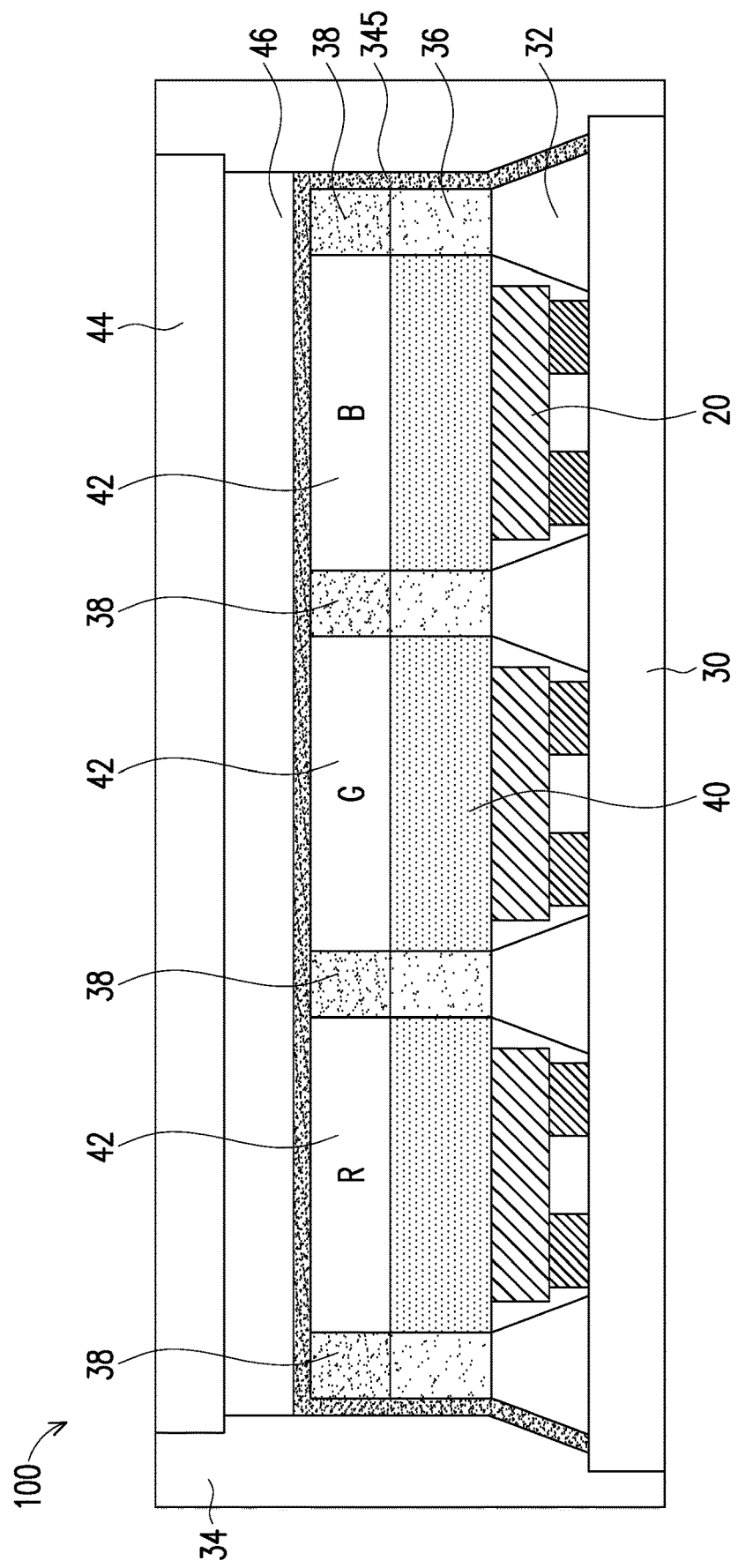

Without departing from the technical concept of the disclosure, the disclosure provides more embodiments of the optical device. FIG. 5A to FIG. 5C are schematic cross-sectional structure diagrams of an optical device according to another embodiment of the disclosure. In the embodiment of FIG. 5A to FIG. 5C, the substrate 30 or the substrate 44 is, for example, but not limited to, glass or sapphire or similar materials with a low permeability to moisture and/or oxygen.

Referring to 5A, based on a manufacturing process on the substrate 30 and the substrate 44, the BM 38 and the color filter layer 42 may be manufactured on the substrate 44. The bank structure 36 and the wavelength conversion layer 40 may be, for example, formed on the substrate 30. Based on the consideration of protecting the wavelength conversion layer 40, in combination with a part of the mode of FIG. 3, a moisture blocking layer 345 may be first formed on the outer sidewall of the bank structure 36 and the outer sidewall of the pixel definition layer 32. The outer sidewall of the pixel definition layer 32 may also be an inclined structure, which is better for the moisture blocking layer 345 to cover the sidewall and contact the substrate 30, and may improve the effect of blocking moisture and/or oxygen.

In addition, the moisture blocking layer 345 may also extend on an upper surface of the bank structure 36 and an upper surface of the wavelength conversion layer 40, that is, cover the optical members disposed on the substrate 30. Here, the moisture blocking layer 345 extends on part of the upper surface of the bank structure 36 and part of the upper surface of the wavelength conversion layer 40, and the moisture blocking layer 345 at least seals the wavelength conversion layer 40 with the substrate 30 to improve an effect of the optical device 100 in blocking moisture and/or oxygen.

The jointing method of the substrate 30 and the substrate 44, for example, the substrate 30 and the substrate 44 may be combined into the optical device 100 by using an adhesive layer 46. The material of the adhesive layer 46 is, for example, a liquid Optical Clear Resin (OCR) or an Optical Clear Adhesive (OCA), a suitable material, or a combination of the foregoing materials. The adhesive layer 46 of the disclosure is not limited to the illustrated mode.

After forming the optical device 100, the disclosure may form the sealing element 34 on the edge of the optical device 100 to reduce the invasion of moisture and/or oxygen from a side and/or a joint surface of the optical device 100.

Referring to FIG. 5B, for example, the color filter layer 42 and the BM 38 may also be formed on the substrate 30. In one embodiment, after forming some optical members on the substrate 30, the moisture blocking layer 345 is formed before the BM 38 and the color filter layer 42 are formed. At this time, the substrate 44 may be a transparent substrate, and no optical members are formed thereon, but it is not limited thereto. The substrate 44 is then combined with the substrate 30 by the adhesive layer 46, such as the OCR or the OCA, to form the optical device 100. As described above, the sealing element 34 may be formed on the edge of the optical device 100 to reduce the invasion of moisture and/or oxygen from the side and/or the joint surface of the optical device 100.

Referring to FIG. 5C, for example, the color filter layer 42 and the BM 38 may also be formed on the substrate 30. In one embodiment, the BM 38 and the color filter layer 42 are formed on the bank structure 36 and the wavelength conversion layer 40 before the moisture blocking layer 345 is formed. Therefore, the moisture blocking layer 345 will cover the color filter layer 42 and the BM 38. Thereafter, the substrate 44 is combined with the substrate 30 to form the optical device 100 by using the adhesive layer 46, such as the OCR or the OCA. As described above, the sealing element 34 may be formed on the edge of the optical device 100 to reduce the invasion of moisture and/or oxygen from the side and/or the joint surface of the optical device 100. At this time, the substrate 44 may be a transparent substrate, and no optical members may be formed on the substrate 44, but it is not limited thereto.

Figure 6A:
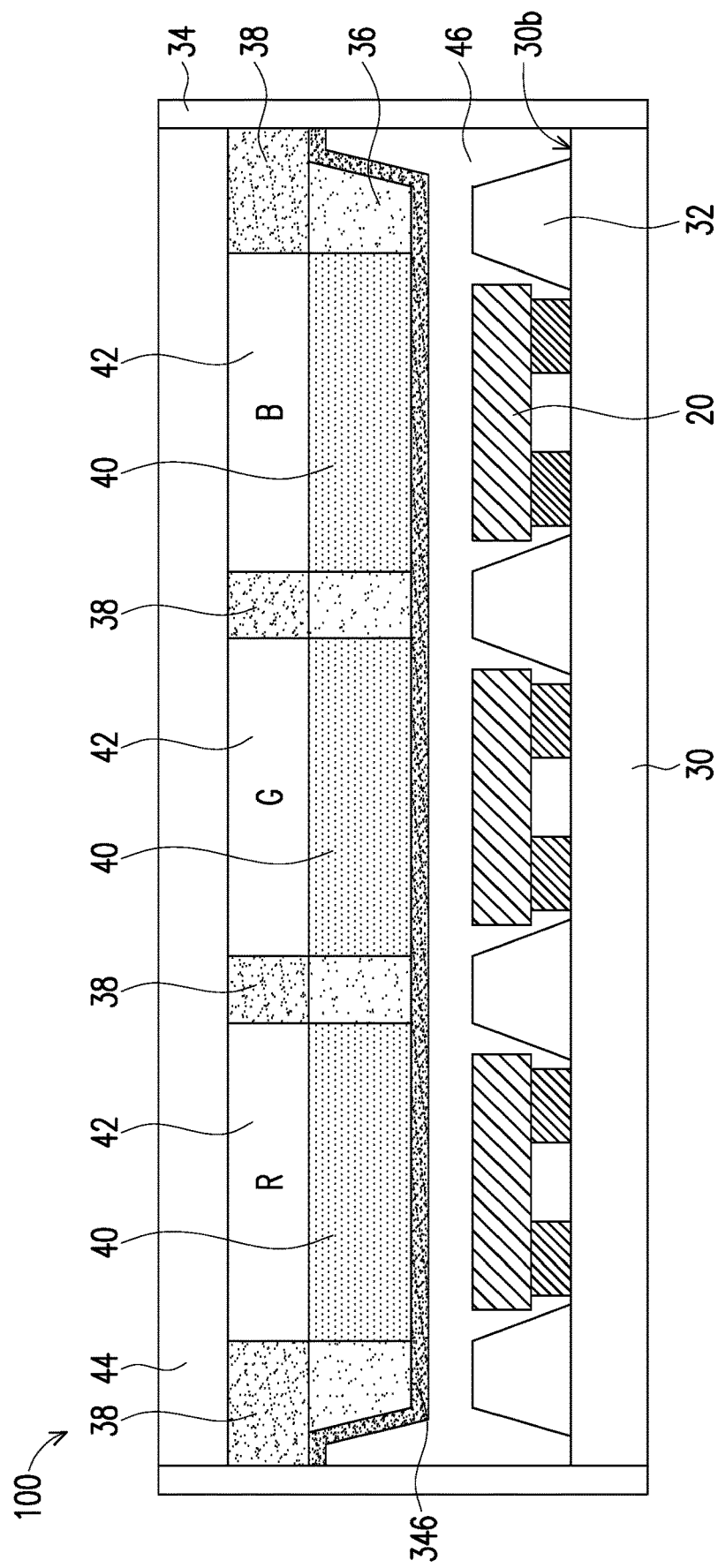
FIG. 6A and FIG. 6B are schematic cross-sectional structure diagrams of an optical device according to another embodiment of the disclosure.
Figure 6B:
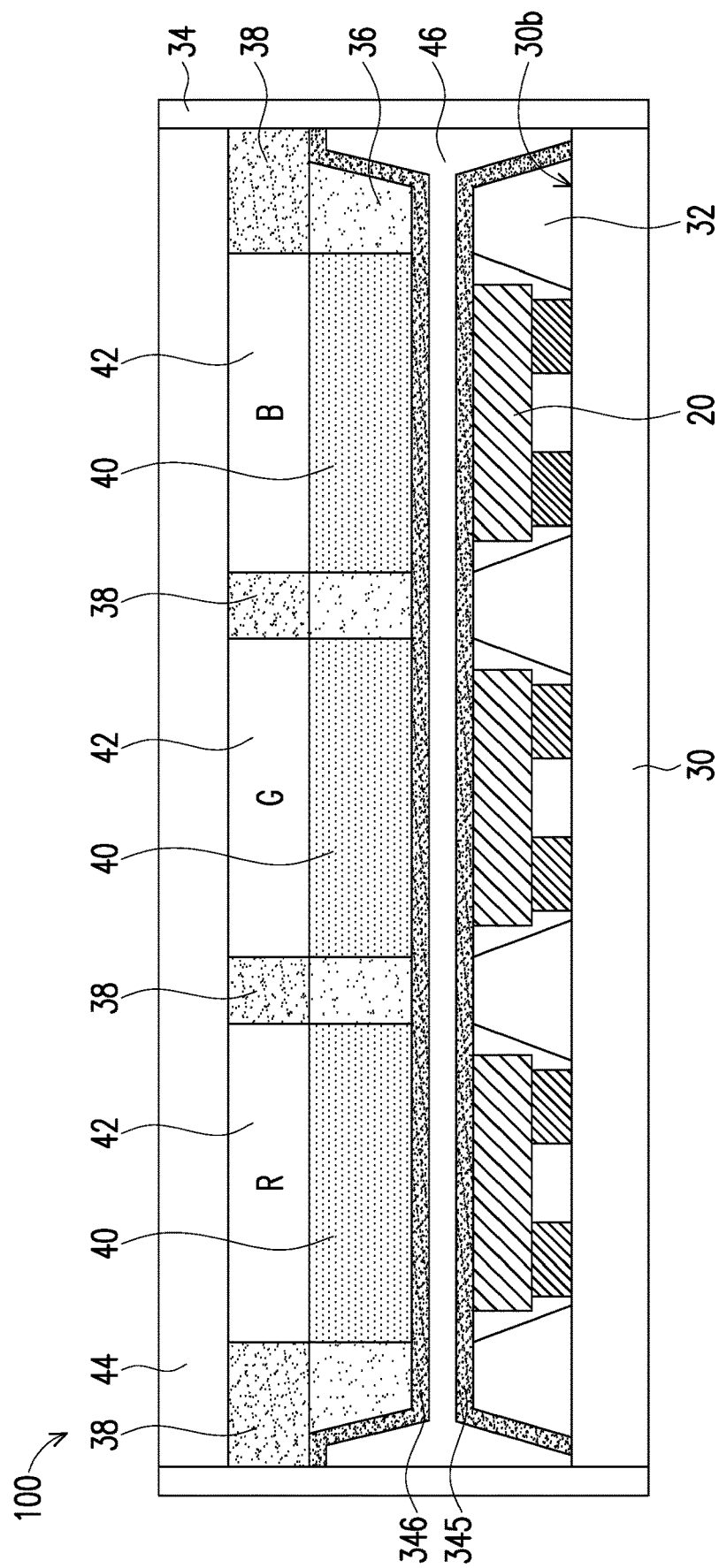

FIG. 6A and FIG. 6B are schematic cross-sectional structure diagrams of an optical device according to another embodiment of the disclosure. In the embodiment of FIG. 6A to FIG. 6B, the substrate 30 or the substrate 44 is, for example, but not limited to, glass or sapphire or similar materials with a low permeability to moisture and/or oxygen. Referring to FIG. 6A, according to a part of the structure of FIG. 3, the optical device may be further modified. Optical members, for example but not limited to, the light emitting unit 20 and the pixel definition layer 32 may be formed on the substrate 30. Optical members including, for example but not limited to, the color filter layer 42, the BM 38, the bank structure 36, the wavelength conversion layer 40 and the moisture blocking layer 346 may be formed on the substrate 44.

The outer sidewall of the pixel definition layer 32 or the outer sidewall of the bank structure 36 also has, for example, a taper portion. The substrate 30 and the substrate 44 are combined into the optical device 100 by, for example, the adhesive layer 46. Thereafter, the sealing element 34 is formed on the edge of the optical device 100 to reduce the invasion of moisture and/or oxygen from the side and/or the joint surface of the optical device 100.

The moisture blocking layer 346 may be selectively not in contact with the substrate 44 and formed on the BM 38 in this embodiment. However, both the sealing element 34 and the moisture blocking layer 346 may reduce the invasion of moisture and/or oxygen from the side and/or the joint surface of the optical device 100.

Referring to FIG. 6B, the structure according to FIG. 6A is further modified. For example, the moisture blocking layer 345 may be further added to cover the optical members on the substrate 30. Here, the moisture blocking layer 345 may selectively cover an upper surface 30b of the substrate 30, or may not cover the upper surface 30b of the substrate 30. In FIG. 6B, the moisture blocking layer 345 is in contact with a part of the upper surface 30b of the substrate 30. The disclosure is not limited to the illustrated mode.

Figure 7:
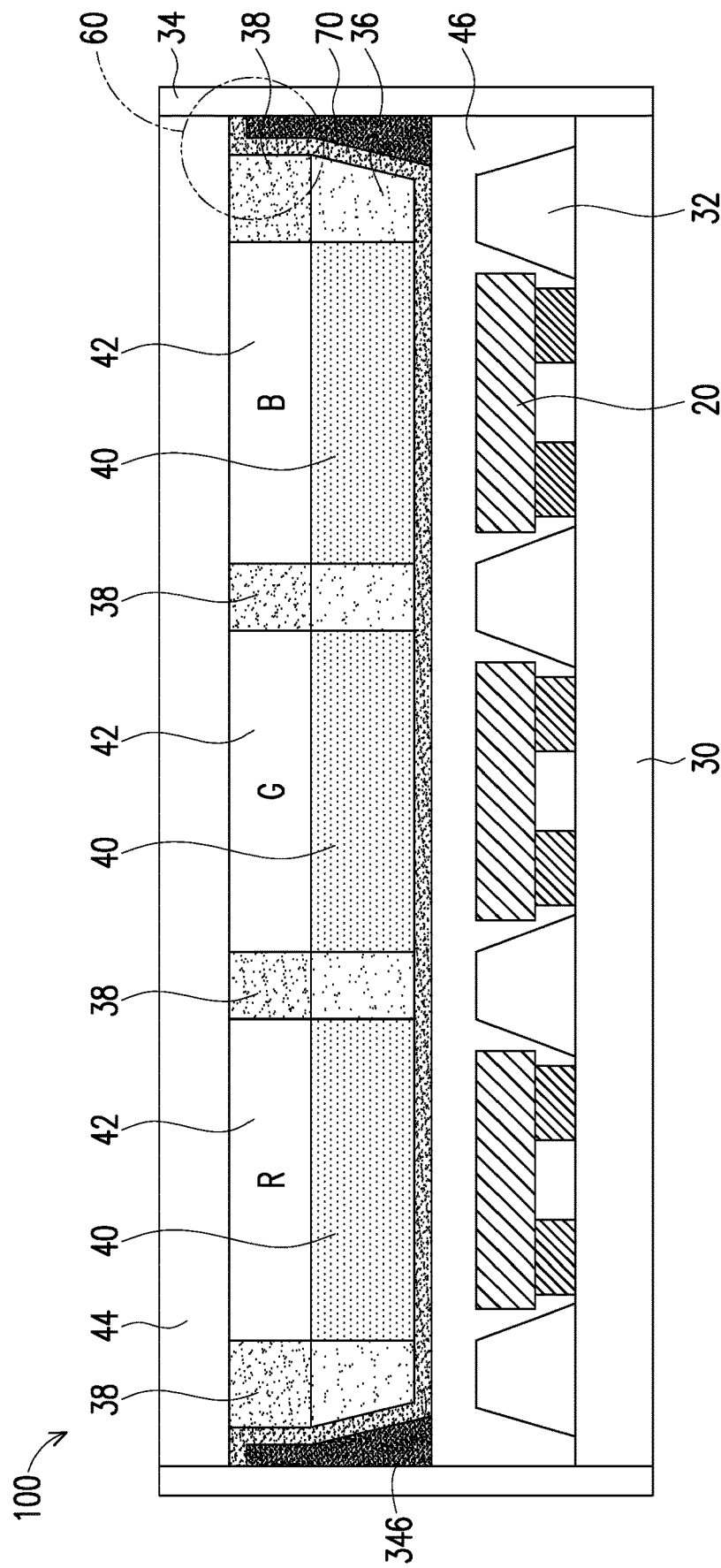
FIG. 7 is a schematic cross-sectional structure diagram of an optical device according to another embodiment of the disclosure.

FIG. 7 is a schematic cross-sectional structure diagram of an optical device according to another embodiment of the disclosure. In the embodiment of FIG. 7, the substrate 30 or the substrate 44 is, for example, but not limited to, glass or sapphire or similar materials with a low permeability to moisture and/or oxygen. Referring to FIG. 7, the moisture blocking layer 346 covers the taper portion formed by the BM 38 and the bank structure 36. On a detailed structure of a local area 60, the moisture blocking layer 346 may be selectively in contact with the substrate 44. In one embodiment, a light shielding layer 70 is formed on the edge of the substrate 44 and located on the moisture blocking layer 346. That may further reduce the leakage of light emitted by the light emitting unit 20 from the side. The image quality of the optical device may be improved.

Thereafter, for example, in the same mode of FIG. 6A, the substrate 44 is combined with the substrate 30 via the bonding layer 46 to form the optical device 100. The sealing element 34 is formed on the outside thereof to reduce the invasion of moisture and/or oxygen from the side and/or the joint surface of the optical device 100.

In addition, as described, the embodiments listed may be partially combined to constitute other embodiments. The disclosure is not limited to the embodiments listed.

Although the embodiments and advantages of the disclosure have been disclosed above, it should be understood that, a person of ordinary skill in the art may make variations, replacements and modifications without departing from the spirit and scope of the disclosure. In addition, the protection scope of the disclosure is not limited to a process, machine, manufacturing, material composition, device, method, and step in a specific embodiment in this specification. A person of ordinary skill in the art may understand the existing or to-be-developed process, machine, manufacturing, material composition, device, method, and step from the content of the disclosure, which may be used according to the disclosure as long as the substantially same function can be implemented or the substantially same result can be obtained in the embodiments described herein. Therefore, the protection scope of the disclosure includes the foregoing process, machine, manufacturing, material composition, device, method, and step. In addition, each claim forms an independent embodiment, and the protection scope of the disclosure also includes a combination of claims and embodiments. The protection scope of the disclosure should be subject to the appended claims.

What is claimed is:

1. An optical device, comprising:
    two substrates in an opposite arrangement, each of which has a surrounding edge and a side surface at the surrounding edge;
    a wavelength conversion layer disposed between the substrates, wherein the wavelength conversion layer is further encapsulated by a moisture blocking layer in association with one of the substrates;
    a light emitting unit disposed corresponding to the wavelength conversion layer and between the corresponding wavelength conversion layer and one of the substrates;
    a sealing element sealing the wavelength conversion layer and the light emitting unit between the substrates, along the surrounding edges and in contact with the side surfaces of the substrates; and
    a bank structure disposed on the one of the substrates, the bank structure having an outer taper portion covered by the moisture blocking layer and an inner taper portion not covered by the moisture blocking layer, wherein the inner taper portion is closer to the wavelength conversion layer than the outer taper portion, wherein an angle of the outer taper portion is less than an angle of the inner taper portion.

2. The optical device according to claim 1, wherein the sealing element is made of silicon oxide.

3. The optical device according to claim 1, wherein the sealing element is formed by a coating process.

4. The optical device according to claim 1, further comprising a light blocking layer disposed between the bank structure and the one of the substrates, wherein a width of the light blocking layer is greater than a width of the bank structure.

5. The optical device according to claim 1, wherein the moisture blocking layer is made of silicon oxide.

6. The optical device according to claim 1, wherein the light emitting unit is further encapsulated.

7. The optical device according to claim 6, wherein the light emitting unit is further encapsulated by the moisture blocking layer in association with the substrates.

* * * * *